(12) United States Patent
Blaesing-Bangert et al.

(10) Patent No.: US 6,323,953 B1
(45) Date of Patent: Nov. 27, 2001

(54) METHOD AND DEVICE FOR MEASURING STRUCTURES ON A TRANSPARENT SUBSTRATE

(75) Inventors: Carola Blaesing-Bangert, Huettenberg; Klaus Rinn, Heuchelheim; Ulrich Kaczynski, Bad Nauheim; Mathias Beck, Solms, all of (DE)

(73) Assignee: Leica Microsystems Wetzlar GmbH, Wetzlar (DE)

( * ) Notice: Subject to any disclaimer, the term of this patent is extended or adjusted under 35 U.S.C. 154(b) by 0 days.

(21) Appl. No.: 09/240,681

(22) Filed: Feb. 2, 1999

(30) Foreign Application Priority Data

Apr. 30, 1998 (DE) .............................................. 198 19 492

(51) Int. Cl.$^7$ .......................... G01N 21/00; G01N 21/88; G01B 11/14
(52) U.S. Cl. ................ 356/614; 356/239.1; 250/559.29; 250/559.36
(58) Field of Search ............................ 356/237.2, 237.4, 356/237.5, 239.1, 239.2, 239.8, 394, 375, 614; 250/559.29, 559.36

(56) References Cited

U.S. PATENT DOCUMENTS

| | | | |
|---|---|---|---|
| 4,218,142 | * 8/1980 | Kryger et al. | 356/394 |
| 4,744,663 | * 5/1988 | Hamashima et al. | 356/375 |
| 4,837,449 | * 6/1989 | Maltby, Jr. | 356/239.8 |
| 4,889,998 | * 12/1989 | Hayano et al. | 356/239.8 |
| 4,966,457 | * 10/1990 | Hayano et al. | 356/239.8 |
| 5,184,021 | 2/1993 | Smith . | |
| 5,563,702 | * 10/1996 | Emery et al. | 356/237.4 |
| 5,786,897 | 7/1998 | Ototake . | |
| 5,892,579 | * 4/1999 | Elyasaf et al. | 356/239.8 |

FOREIGN PATENT DOCUMENTS 35 14 459   2/1986   (DE) .

OTHER PUBLICATIONS

*SPIE*, vol. 3096, entitled "Advanced Mask Metrology System for up to 4Gbit DRAM" by T. Ototake, pp. 433–444.
VDI Berichte, No. 1102 (1993) entitled "Edge Measurement on Microstructures" by W. Mirandé.

* cited by examiner

Primary Examiner—F. L. Evans
Assistant Examiner—Zandra Smith
(74) *Attorney, Agent, or Firm*—Crowell & Moring LLP

(57) ABSTRACT

A measuring device for measuring structures on a transparent substrate includes an incident-light illuminating device, an imaging device, and a detector device for the imaged structures and a measuring stage for receiving the substrate. The stage is displaceable in an interferometrically measurable fashion perpendicularly to and relative to an optical axis of the imaging device. The measuring stage is designed as an open frame with a receiving edge for the substrate. A transmitted-light illuminating device is provided beneath the measuring stage. The optical axis of the transmitted light illuminating device is aligned with that of the incident-light illuminating device.

38 Claims, 2 Drawing Sheets

METHOD AND DEVICE FOR MEASURING STRUCTURES ON A TRANSPARENT SUBSTRATE

BACKGROUND AND SUMMARY OF THE INVENTION

This application claims the priority of German Application No. 198 19 492.7, filed Apr. 30, 1998, the disclosure of which expressly incorporated by reference herein.

The invention relates to a method and device for measuring structures on a transparent substrate. The device includes an incident light-illuminating device, an imaging device, and a detector device for detecting imaged structures, as well as a measuring stage for holding the substrate. The measuring stage is displaceable in an interferometrically measurable fashion relative to an optical axis of the imaging device.

A measuring device of this type was described, for example, in the text of the paper entitled "Pattern Placement Metrology for Mask Making," presented by Dr. Carola Bläsing at the Semicon meeting, Education Program, in Geneva, Switzerland on Mar. 31, 1998, the disclosure of which is incorporated by reference herein. The measuring device is set up in an environmental climate chamber in order to achieve measurement accuracy in the nanometer (nm) range. The position coordinates of various structures or features, such as pattern edges and the like, which are formed on substrates, such as photomasks and semiconductor wafers, are measured. The measuring device is mounted on a vibration-damped granite block. The masks and wafers are placed on the measuring stage by an automatic handling system.

The measuring stage moves by sliding via air bearings on the surface of the granite block. Plane mirrors arranged perpendicular to one another (orthogonal) are mounted at two sides of the measuring stage. A laser interferometer system determines the position of the measuring stage.

Using high-resolution apochromatically corrected microscope optics, the structures to be measured are illuminated and imaged with incident light in the near ultraviolet (UV) spectral range. A CCD camera serves as the detector for the imaged structures. Individual pixels form a detector array of the camera. Measurement signals are obtained from the individual pixels that are located within a defined measuring window. An intensity profile of the measured structure is derived from the measured signals by image processing, from which the edge position of the structure can be determined, for example.

The measuring device described above is preferably used for determining the edges of structures on masks and wafers for semiconductor manufacture. The structures are formed in layers which are applied to the mask surface. The surfaces have different degrees of reflectance. The edges (or flanks) of these layers have different steepnesses (slopes) because of the manufacturing process and are made with varying degrees of cleanliness. A TV autofocusing system is used in the measuring device to look for the setting with the sharpest contrast in order to optimize the image of the edge. The position of the edge measured at this setting relative to the optical axis of the imaging system, combined with the measured stage position, gives the position coordinates of the structural element in the machine's coordinate system. The position coordinates in the machine coordinate system can be converted into a mask coordinate system, following the previous alignment of the mask within the machine (measuring device), and compared with design data of the structural elements. In the case of linear structural elements for example, both edge positions can also be measured. The center line (or midpoint between the edges) can then be chosen as the position coordinate for this purpose. In cruciform (crossed) structures, the intersection of the center lines can be specified as the position.

The measured edge position depends on the physical quality of the edge itself and also on the optical measurement method employed, together with the quality of the imaging system. The relationships are described in the paper "Edge Measurement on Microstructures," W. Mirandé, VDI Berichte, No. 1102 (1993), pages 137 et seq. If the position of the structure is defined by the center line to the two edges, the influences on the measured edge position generally have no effect on the measured position of the structure. The evaluation of the measurement results for a structural width measurement on the other hand can produce different results in different measuring devices.

In semiconductor manufacturing, the mask is illuminated with transmitted light in a stepper device and imaged onto the semiconductor wafer. Hence, there is interest in being able to determine the actual light-shading width of the structural element. For this purpose, special measuring microscopes have been developed in which the mask is illuminated by transmitted light and the width of the opaque structural image is measured exclusively. These known measuring devices however, do not provide for determining the position coordinates of the structural elements. These considerations likewise apply if transparent structural elements, rather than opaque structural elements, are to be measured in the mask surface.

The increasing quality control demands in mask manufacture require the manufacturer to check the design parameters of the mask structures, i.e. the structural elements, in terms of both their position and their effective projection width. Moreover, this checking process must be done within increasingly shorter processing times. The necessary cleanliness requirements also demand an increasing degree of care in the handling processes for placing the mask in the measuring device. With increasing mask size and increasing structural density, the value of the mask (for example its manufacturing cost) increases with each step in the process as well, so that careful handling in order to protect the masks from damage or destruction becomes a significantly important factor.

Hence, the goal of the present invention is to provide a method and measuring device with which both exact position determination and a reliable statement regarding the structural width of the structures on the substrate are possible without requiring knowledge of the geometric edge profiles of the substrate.

This and other goals are achieved in a measuring device according to the present invention in which the measuring stage is designed as an open frame with a ledge for receiving the substrate, and an illuminating device which uses transmitted light is provided beneath the measuring stage. The optical axis of the illuminating device is aligned with that of the incident light illuminating device. In a method suitable for achieving the stated goal, the substrate is illuminated, according to the invention, with either incident or transmitted light. Advantageous improvements follow from the features described herein.

The design of the measuring device which is known of itself according to the invention makes it possible to measure both the position coordinates and the structural widths of structures on substrates using incident and transmitted light illumination with only one handling process of the substrate in the same measuring device. This advantageously eliminates the set-up time which otherwise would be necessary for moving to a second measuring device and also minimizes the measuring time, thus speeding up the process and increasing the quality control. The elimination of an additional measuring device makes the inspection cheaper, simplifies the incorporation of an inspection measuring device into a processing line, and reduces the risk of the substrate being destroyed during handling. Direct comparison of the measured values using different types of illumination under evaluation conditions which are otherwise the same permits an expanded analysis of the mask manufacturing processes.

Surprisingly, it has been found that the measurement accuracy of the measuring device for measuring position coordinates can be retained even when the measuring stage is designed as a frame. The structural width can be measured with the same accuracy using transmitted light illumination as that of the position coordinates, and the structural width can be associated with a precisely determined position on the mask. The comparison of the measured values with the edge position using incident and transmitted light provides additional information about the design of the edges. In this manner, asymmetric edge profiles can be detected in particular, and the structural elements can be employed to correct the position coordinates.

Other objects, advantages and novel features of the present invention will become apparent from the following detailed description of the invention when considered in conjunction with the accompanying drawings.

DETAILED DESCRIPTION OF THE DRAWINGS

Figure 1:
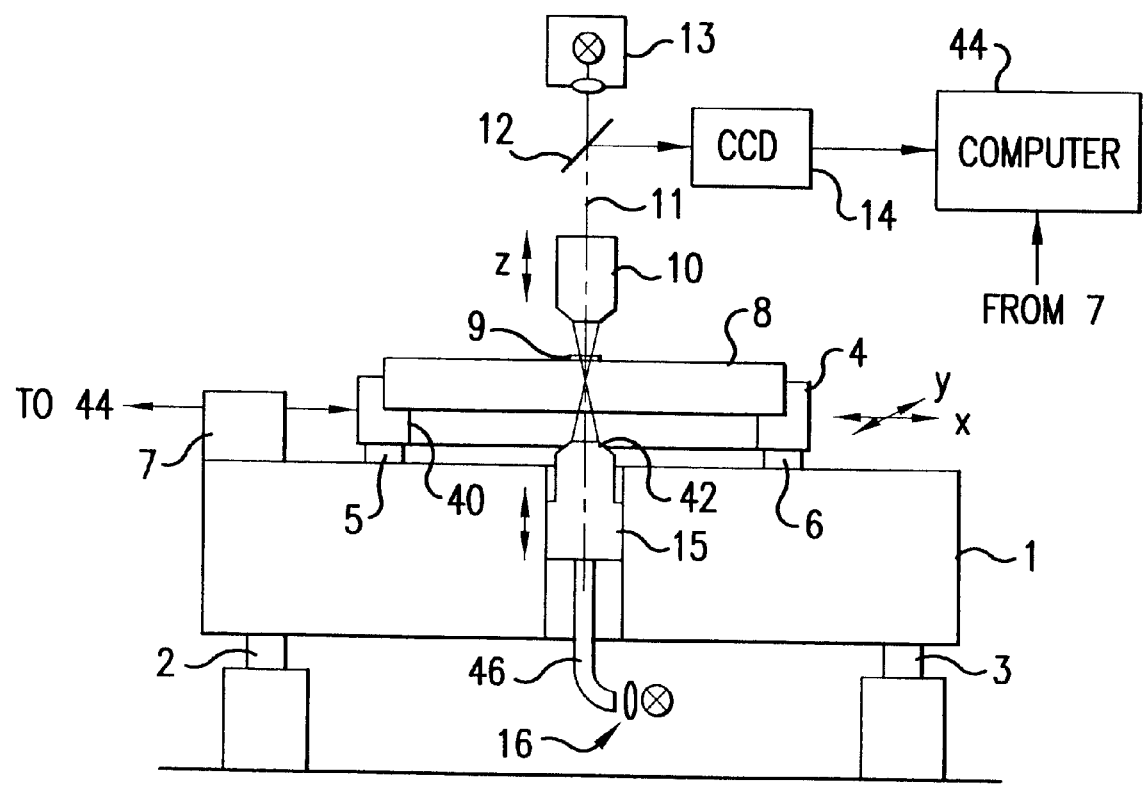
FIG. 1 is a side view block diagram of the measuring device according to the invention.

The embodiment shown in FIG. 1 is of the measuring device consisting of a granite block 1 mounted in a vibration-damping fashion on feet 2, 3. A measuring stage 4, designed as a frame having an opening 40, is displaceable on the granite block 1 via air bearings 5, 6 in two orthogonal directions x,y indicated by the arrows. The frame of the measuring stage 4 advantageously consists of a glass ceramic with a low thermal coefficient of expansion. The drives which move the measuring stage are not shown for purposes of clarity. The position of the measuring stage 4 is detected in the x and y directions using a laser interferometer system 7.

A substrate, such as mask 8, is placed within the frame of the measuring stage 4. The mask 8 consists of a transparent material such as quartz glass for example having various structures, such as pattern features, arranged on its surface. Since the measuring stage 4 is designed as a frame, the mask 8 can also be transilluminated from below through the frame opening 40.

A high quality optical imaging system 10 is arranged above the mask 8. The imaging system 10 can be adjusted in the z-direction for focusing the light beam along its optical axis 11. By means of a beam splitter 12, the light from an illuminating light source 13 is conducted alone the optical beam path, and the imaging beams from the mask are deflected to a detector device 14. The detector device 14 can be a CCD camera for example, having a high-resolution pixel detector array. In a preferred embodiment, the light source 13 emits light in the near UV spectral range.

An additional illuminating device is arranged on an opposite side of the mask 8, for example within the granite block 1. The additional illuminating device consists of a vertically adjustable condenser 15 and a light source 16. The exit surface of a light guide 46 can be used as the light source 16. The optical axis of the condenser 15 is aligned with the optical axis 11 of the imaging system 10. The vertical adjustment of the condenser 15 with the light source 16 is used to adjust the illuminating beams to be aimed at the structure 9 on the mask in order to account for various optical thicknesses of the masks 8 which can be measured in the frame. The condenser head 42 can extend, in particular, into the opening 40 of the measuring stage frame 4. To protect against damage when the measuring stage is displaced over the entire surface of the mask 8 however, the condenser head 42 can be lowered under the top surface of the granite block as well. The light sources 13 and 16 can be switched on independently of one another.

A computer 44, operating under software control for example, receives the detected image signals from the pixel detector array 14, as well as position information signals from the interferometer system 7. Of course it will be understood that the computer 44 can also function to control the optical imaging systems 10, 15 as well as the drive units (not shown) for the measuring stage 4. The computer 44 is programmed to process the detected images to determine measurement information with respect to the structures on the substrate in a known fashion as will be discussed below.

Figure 2:
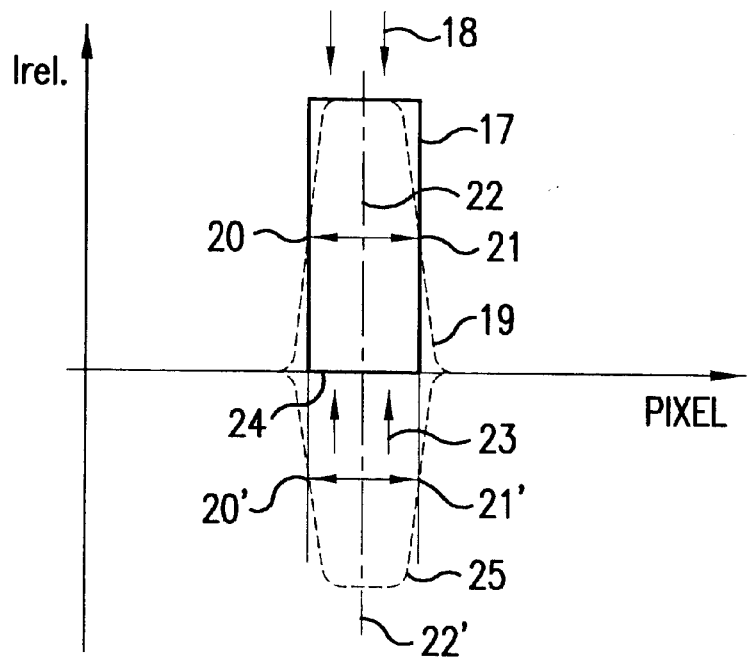
FIG. 2 is a graph of an intensity profile formed using incident and transmitted light according to the invention as well as a structural profile illustrating the evaluation according to the invention.

In FIG. 2, a cross section through an ideally shaped structural element 17 (solid lines) is shown superimposed in the form of an elongated rectangle on the graph of the relative intensity profile detected by the pixel array. The structural height of the ideal structural element 17 can be approximately 100–200 nm. If such a structural element 17 is illuminated with incident light 18 which is then reflected and imaged on the pixel detector array camera 14, then even with optimum focusing via the imaging system 10, the resulting image will be unsharp in the edge area as a result of diffraction effects. The diffraction disk of each image point is larger than one pixel element. A relative intensity profile 19 derived transversely to the edges from the pixel intensities of the CCD elements when represented schematically has the pattern shown in dashed lines on the top half of FIG. 2. It follows from theoretical considerations that the positions of the edges 20, 21 of the structural element 17 are best determined at the 50% intensity level of the intensity profile. The center line 22 with respect to the edge positions 20, 21 determined in this fashion (by the 50% intensity level) is used to define the position coordinates of the structural element 17.

If the same structural element 17 is illuminated by light 23 transmitted through the transparent mask 8, the structural element 17 Will appear as a dark shadow 24 to the imaging optics 10. Here again the shadow edges (boundaries) are imaged more or loss sharply on the CCD detector elements. In the same way, a relative intensity profile 25 is obtained that is plotted on the bottom half of FIG. 2 in dashed lines. If the position of the edge is again defined using the 50% level of the intensity profile, then the same edge positions 20', 21' are obtained in this deal case as with the incident light 18. Also, the same posit-on coordinates are determined at the center line 22'. The width of the structural element 17 from one edge to the other (indicated by the arrows), results in the same value whether obtained from the difference between the two edge positions 20, 22 or the edge positions 20', 21'.

Figure 3:
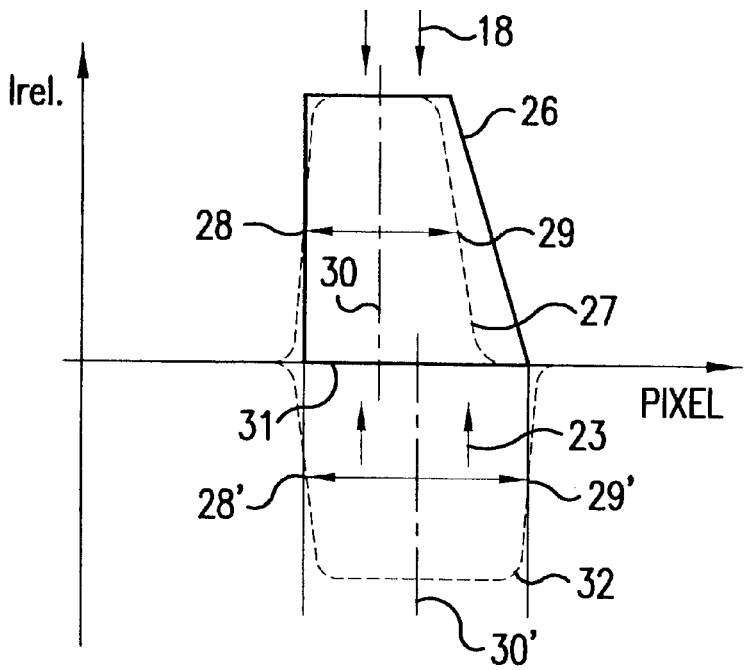
FIG. 3 is another graph of structural and intensity profiles according to the invention.

In reality however, an actual structural element 26 could have the asymmetrically trapezoidal edge profile 26 (solid lines) shown in FIG. 3. As an alternative example, the edges could drop off steeply on both sides of the structural element such that there is unilateral widening only in the foot area, for example due to unclean etching processes. The TV autofocus system in any event will adjust the imaging to the image of the surface of the structural element having the highest contrast. The slanted surface of the asymmetric part of the edge profile has almost no effect on this imaging. Therefore, with the incident light 18, an intensity profile 27 similar to that of FIG. 2 is obtained from which edge positions 28, 29 and position coordinates 30 of the structural element 26 are derived, even though the actual edge profiles differ between the actual and ideal cases.

However, in accordance with the present invention, using light 23 transmitted through the transparent mask 8, only the foot area of the structural element 26 is critical for determining the shadow 31 imaged onto the CCD detector array. Therefore, once again an essentially symmetric intensity profile 32 is obtained, with an edge position 29' (50% intensity level) that is displaced toward the right in comparison to measuring with only the incident light 18. The difference between the edge positions 28', 23' initially results in the measurement of a greater structural width of the actual structural element 26, as well as different position coordinates determined by the center line 30'. The difference between the position coordinates 30, 30' therefore indicates the asymmetry of the edge profile 26. With this information, the mask manufacturer is thus able to better analyze the manufacturing process.

Of course, it is evident that for a symmetrically trapezoidal edge profile, the position coordinates determined by the center lines using incident and transmitted light measurements will not be different. Here, it is only the information about the structural width that changes. This also provides useful information about the manufacturing process.

The method and measuring device according to the invention have been described using the schematic edge and intensity profiles shown for illustrative purposes. It will be readily understood that the edge and intensity profiles can be more complex, especially in the case of structural widths and structural intervals in the range of the light wavelength.

The comparisons made available by the above described measurement data obtained using incident and transmitted light are only valid because the measurement data are obtained with equal localization of the substrate and with the same imaging and evaluation systems being used. The present invention makes possible for the first time the allocation of a structural width measured using transmitted light which can be assigned to an absolute position indication for this structure in the mask coordinate system.

The foregoing disclosure has been set forth merely to illustrate the invention and is not intended to be limiting. Since Modifications of the disclosed embodiments incorporating the spirit and substance of the invention may occur to persons skilled in the art, the invention should be construed to include everything within the scope of the appended claims and equivalents thereof.

What is claimed is:

1. A measuring device for measuring positions of edges of structures on a transparent substrate, comprising:

an incident-light illuminating device operating during a first time period;

an imaging device;

a detector device for detecting images of the structures; and a measuring stage that is displaceable perpendicularly and relative to an optical axis of the imaging device such that its positions can be measured interferometrically, said measuring stage receiving the substrate;

wherein the measuring stage is designed as an open frame with a receiving edge for the substrate; and further comprising a transmitted light illuminating device operating during a second time period different from said first time period and provided beneath the measuring stage, with an optical axis of the transmitted light illuminating device being coaxial with that of the incident-light illuminating device, a position and effective width of said structures being defined by the distance to said edges of said structures from a reference point.

2. The measuring device according to claim 1, wherein the detector device is a CCD camera.

3. The measuring device according to claim 1, wherein the incident-light and transmitted-light illuminating devices can be switched on independent of one another.

4. A method for measuring positions of edges of structures on a transparent substrate which is shiftable in an interferometrically measurable manner in a plane perpendicular to an imaging direction, comprising the acts of:

illuminating the structures on the transparent substrate with light incident on the substrate during a first phase and with light transmitted through the substrate during second phase; and imaging the illuminated structures on a detector device for determining measurements, a position and effective width of said structures being defined by a distance to said edges of said structures from a reference point.

5. The method according to claim 4, further comprising the act of evaluating the structures using at least one of incident and transmitted-light illumination for structural width measurement.

6. A device for measuring positions of edges of a structure on a substrate to be measured, comprising:

a measuring stage having an opening for receiving the substrate; and an image detector which forms a first image of the structure based on light incident on the structure during a first phase from a first side of the substrate to be measured along a first optical axis perpendicular to a movement plane of the measuring stage, and a second image of the structure based on light transmitted through the substrate to be measured past the structure during a second phase from a second side of the substrate to be measured along a second optical axis coaxial with the first optical axis, a position and effective width of said structure being defined by a distance to said edges of said structure from a reference point.

7. The device according to claim 6, wherein a ledge is formed at least partially about an interior periphery of the opening in the measuring stage.

8. The device according to claim 6, wherein the opening in the measuring stage has a shape substantially corresponding to that of the substrate to be measured.

9. The device according to claim 8, wherein a ledge is formed at least partially about an interior periphery of the opening in the measuring stage.

10. The device according to claim 6, further comprising an interferometer system which detects movement of the measuring stage relative to the first and second optical axes.

11. The device according to claim 6, further comprising:
a first illumination light source which provides the light incident on the structure; and
a second illumination light source which provides the light transmitted through the substrate to be measured.

12. The device according to 11, wherein the first and second illumination light sources are activatable independently of one another.

13. The device according to claim 11, wherein the second illumination light source is arranged beneath the measuring stage.

14. The device according to claim 13, further comprising:
a base on which the moveable measuring stage is arranged; and
wherein the second illumination light source includes a vertically adjustable condenser arranged within the base.

15. The device according to claim 6, wherein the image detector is a CCD camera.

16. The device according to claim 15, further comprising:
a computer coupled to the image detector for processing the first and second images to obtain measurement results relating to the structure on the substrate to be measured.

17. The device according to claim 6, further comprising:
a computer coupled to the image detector for processing the first and second images to obtain measurement results relating to the structure on the substrate to be measured.

18. A device for measuring positions of edges of a structure on a substrate to be measured, comprising:
a measuring stage having an opening for receiving the substrate;
a first illumination light source providing incident light during a first time period on the structure from one side of the measuring stage along a first optical axis substantially perpendicular to the stage; and
a second illuminating light source providing light transmitted through the substrate during a second time period different from said first time period on the structure from an opposite side of the measuring stage along a second optical axis coaxial with the first optical axis; and
an image detector receiving the incident and transmitted light to detect images of the structure, position and effective width of said structure being defined by a distance to said edges of said structure from a reference point.

19. The device according to claim 18, wherein a ledge is formed at least partially about an interior periphery of the opening in the measuring stage.

20. The device according to claim 18, wherein the opening in the measuring stage has a shape substantially corresponding to that of the substrate to be measured.

21. The device according to claim 20, wherein a ledge is formed at least partially about an interior periphery of the opening in the measuring stage.

22. The device according to claim 18, further comprising an interferometer system which detects movement of the measuring stage relative to the first and second optical axes.

23. The device according to claim 18, wherein the second illumination light source is arranged beneath the measuring stage.

24. The device according to claim 23, further comprising:
base on which the moveable measuring stage is arranged; and
wherein the second illumination light source includes a vertically adjustable condenser arranged within the base.

25. The device according to claim 18, wherein the image detector is a CCD camera.

26. The device according to claim 18, further comprising:
a computer coupled to the image detector for processing the first and second images to obtain measurement results relating to the structure on the substrate to be measured.

27. The device according to 18, wherein the first and second illumination light sources are activatable independently of one another.

28. A method for obtaining information about position of edges of a structure formed on a first side of a substrate, the method comprising the acts of:
fixing said substrate;
illuminating the structure with light transmitted through the substrate from a second, opposite side of the substrate; and
detecting from the first side of the substrate a first image of the structure based on the transmitted light a position and effective width of said structure being defined by a distance to said edges of said structure from a reference point.

29. The method according to claim 28, further comprising the acts of:
illuminating the structure with light incident on the structure from the first side of the substrate; and
detecting from the first side of the substrate a second image of the structure based on the incident light.

30. The method according to claim 29, further comprising the act of comparing the first and second images of the structures to evaluate edge and coordinate position of the structure.

31. The method according to claim 29, wherein the acts of illuminating the structure with the transmitted and incident light use coaxial optical axes, and further comprising the act of:
determining movements of the substrate relative to the coaxial optical axes in a plane perpendicular to the optical axes.

32. The method according to claim 28, further comprising the act of:
evaluating features of the structure using the first image formed with the transmitted light.

33. The method according to claim 29, further comprising the act of:
evaluating features of the structure using the images formed with the incident and transmitted light.

34. The method according to claim 29, wherein the images of the structure are light intensity profiles formed via a CCD camera.

35. A method for obtaining information about positions of edges of a structure formed on a surface of a substrate, the method comprising the acts of:
alternately illuminating the structure from one side of the substrate with incident light and from another side with transmitted light; and
detecting images of the structure with a common detector based on the incident and transmitted light a position and effective width of said structures being defined as a distance to said edges of said structure from a reference point.

36. The method according to claim 35, further comprising the act of:

detecting relative movements between the substrate and optical axes of the incident and transmitted light, which optical axes are coaxial and perpendicular to the relative movements.

37. The method according to claim 36, further comprising the act of:

comparing images of the structure respectively formed with the incident and transmitted light to determine position coordinates of the structure.

38. The method according to claim 35, further comprising the act of:

evaluating edge positions of the structure for a structural width measurement based on the incident and/or transmitted light.

* * * * *